(12) United States Patent
Amazeen et al.

(10) Patent No.: US 6,400,302 B1
(45) Date of Patent: Jun. 4, 2002

(54) QUASI-DIFFERENTIAL SUCCESSIVE-APPROXIMATION STRUCTURES AND METHODS FOR CONVERTING ANALOG SIGNALS INTO CORRESPONDING DIGITAL SIGNALS

(75) Inventors: Bruce Edward Amazeen, Ipswich; Michael Christian Wohnsen Coln, Lexington, both of MA (US); Gary Robert Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/795,026

(22) Filed: Feb. 26, 2001

(51) Int. Cl.$^7$ ................................................ H03M 1/12
(52) U.S. Cl. ....................... 341/172; 341/150; 341/163
(58) Field of Search ................................ 341/150, 163, 341/172, 143

(56) References Cited

U.S. PATENT DOCUMENTS

| | | | | |
|---|---|---|---|---|
| 4,399,426 A | * | 8/1983 | Tan | ............................ 340/347 |
| 4,803,462 A | * | 2/1989 | Hester et al. | ................ 341/172 |
| 4,831,381 A | * | 5/1989 | Hester | .......................... 341/172 |
| 4,989,002 A | * | 1/1991 | Tan | ............................... 341/120 |
| 5,581,252 A | * | 12/1996 | Thomas | ....................... 341/144 |
| 5,684,487 A | * | 11/1997 | Timko | |
| 5,889,486 A | * | 3/1999 | Opris | .......................... 341/150 |
| 6,054,945 A | * | 4/2000 | Doyle | ......................... 341/150 |
| 6,124,818 A | * | 9/2000 | Thomas et al. | ............. 341/155 |

* cited by examiner

Primary Examiner—Michael Tokar
Assistant Examiner—Khai Nguyen
(74) Attorney, Agent, or Firm—Koppel, Jacobs, Patrick & Heybl

(57) ABSTRACT

Quasi-differential successive-approximation methods and structures are provided for converting analog signals into corresponding digital signals. These methods and structures realize the signal-to-noise improvements of fully-differential SAR ADCs and the calibration accuracy improvements of pseudo-differential SAR ADCs. Structures of the invention operate in a fully-differential mode to establish more-significant bits of the corresponding digital signals and in a pseudo-differential mode to establish the less-significant bits.

26 Claims, 7 Drawing Sheets

QUASI-DIFFERENTIAL SUCCESSIVE-APPROXIMATION STRUCTURES AND METHODS FOR CONVERTING ANALOG SIGNALS INTO CORRESPONDING DIGITAL SIGNALS

BACKGROUND OF THE INVENTION

1. Field of the Invention

The present invention relates generally to successive approximation register analog-to-digital converters (SAR ADCs).

2. Description of the Related Art

The conventional SAR ADC 20 of FIG. 1 comprises a sampler 22 that is coupled to a switched capacitor (or charge distribution) digital-to-analog converter (CDAC) 24, a successive approximation register (SAR) 26, a comparator 28 that is coupled between the CDAC 24 and the SAR 26 and a timing and control module 30 that is coupled to the sampler 22 and the SAR 26.

The CDAC includes an array of capacitors whose capacitances are binarily weighted. For example, a most-significant capacitor has a capacitance C/2, a next most-significant capacitor has a capacitance C/4 and so on. The least-significant capacitor has a capacitance of $C/2^n$ and is duplicated by a capacitor 31 so that the total array capacitance is C. Accordingly, binary division is realized when each capacitor's capacitance is successively compared to the array capacitance (e.g., as a capacitive divider, capacitance C/2 is ½ that of the array capacitance C, capacitance C/4 is ¼ that of the array capacitance and so on).

The capacitor top plates (e.g., the top plate 32) are coupled to one differential port 33 of the comparator 28 and their bottom plates (e.g., the bottom plate 34) are selectively coupled through bottom-plate switches 35 to a sample (IN) from the sampler 22, to a first reference signal which is generally that applied to the comparator's other differential port 36 (e.g., GND) and to a second reference signal (REF) which is generally the full scale range of the SAR ADC 20. The bottom-plate switches 35 respond to control signals 37 from the SAR 26 which also controls an output switch 38 that selectively causes the CDAC's analog output signal to be coupled to the comparator 28 or to ground.

In operation of the SAR ADC, an analog signal is presented to the input port 39 of the sampler (e.g., a sample-and-hold amplifier (SHA)) and, in response to a hold signal from the timing and control module, the sampler provides an input signal sample $S_{in}$ to the input port (IN) of the switched capacitor DAC 24. Initially, the output switch 38 applies a ground to all of the top plates 32 and the bottom-plate switches 35 couple the input signal sample $S_{in}$ to all of the bottom plates 34 so that all capacitors acquire a potential of $S_{in}$. Subsequently, the SAR causes the output switch 38 to couple the top plates 32 to the comparator's differential port 33 and the switches 35 to couple the bottom plates 34 to GND so that a potential $-S_{in}$ appears at the comparator's differential port 33.

The SAR 26 then causes the bottom plate of the capacitor C/2 to be switched to REF and a capacitive divider ratio of (C/2)/C changes the potential at the differential port 33 to $REF/2-S_{in}$. This latter signal is illustrated in the diagram 40 of FIG. 2A. If the comparator output indicates that $REF/2-S_{in}$ is below GND, the SAR leaves the bottom plate of capacitor C/2 coupled to REF. If the comparator output indicates that $REF/2-S_{in}$ is above GND (as in FIG. 2A), the SAR returns the bottom plate to GND. This process is repeated with the next capacitor C/4 which changes the potential at the differential port 33 to $REF/4-S_{in}$. FIG. 2A illustrates that $REF/4-S_{in}$ is less than GND so that the SAR leaves the bottom plate of capacitor C/4 coupled to REF.

This process is repeated for the remaining capacitors to complete a successive approximation sequence that causes the potential on the top plates to approximate the potential at the comparator's other differential port 36 (i.e., GND) and thereby causes the control signals 37 to become a binary weighted version of the input sample $S_{in}$. That is, the control signals form a successive approximation word that corresponds to the input sample $S_{in}$ and is delivered over a digital output bus 41. The conversion process may be controlled through a control bus 42 that couples the timing and control module 30 to external components. Because the above-described operation is based upon successive approximation words from the SAR, this type of ADC is generally referred to as a SAR ADC.

A principal advantage of CDACs is that their accuracy and linearity are primarily determined by photolithography which defines capacitor plate areas to thereby establish capacitances and capacitance matching. In addition, small calibration capacitors can be added and switched under control of the SAR 26 to improve accuracy and linearity and eliminate the need for ADC trimming routines (e.g., thin-film laser trimming). CDACs also reduce static currents and DC power dissipation and provide a high degree of temperature stability because the temperature tracking between switched capacitors is typically quite high (e.g., better than 1 ppm/° C.).

The SAR ADC 20 is an example of a single-ended SAR ADC configuration. In another single-ended configuration, the calibration capacitors are in the form of a second CDAC which is also coupled to the differential port 33 of the comparator 28 of FIG. 1. The second CDAC provides analog correction signals that compensate for capacitance mismatches in the first CDAC 24. The switches (e.g., metal-oxide semiconductor (MOS) switches) of single-ended SAR ADC configurations typically inject error charges into the comparator (28 in FIG. 1) and these switching-induced errors are difficult to eliminate.

Accordingly, another conventional SAR ADC configuration adds a "dummy" CDAC and couples it to the comparator's other differential port (36 in FIG. 1) and drives the dummy's capacitor array with a fixed reference (e.g., GND). This creates a pseudo-differential configuration which injects similar error charges into the differential input of the comparator so that the errors are substantially reduced by the common-mode rejection of the comparator. Because it adds a third CDAC, this pseudo-differential configuration requires substantial integrated circuit area.

Circuit area is reduced in a different pseudo-differential configuration in which the dummy CDAC at the other differential port (36 in FIG. 1) provides the analog correction signals and accordingly, the second CDAC at the differential port 33 can be eliminated.

Pseudo-differential configurations reduce switching-induced errors but their signal-to-noise ratio (SNR) is less than desired. The SNR is substantially improved in a fully-differential configuration in which first and second CDACs are coupled differentially to the comparator and are both driven with successive approximation signals from the SAR so their analog signals to the comparator (28 in FIG. 1) change in opposite and equal steps during the successive approximation sequence.

Exemplary differential signals are illustrated in the diagram 44 of FIG. 2B where $REF/2-S_{in}$ is compared to −REF/2+$S_{in}$. Successively, REF/4−$S_{in}$ is compared to −REF/4+$S_{in}$ and so on. Because −REF/2+$S_{in}$ does not exceed REF/2−$S_{in}$, the SAR returns the bottom plates of capacitors C/2 of the first and second CDACs to GND. In contrast, −REF/4+$S_{in}$ exceeds REF/4−$S_{in}$, so that the SAR leaves the bottom plates of capacitors C/4 of the first and second CDACs coupled to REF.

In a fully-differential configuration, the sampler 22 of FIG. 1 would have a differential input port 46 and the differential signals would vary from positive full scale of REF and GND respectively at the upper and lower sides of the port to negative full scale of GND and REF respectively at the upper and lower sides. The input signal range of a fully-differential configuration is therefore effectively doubled while noise has not been substantially changed so that the SNR is also substantially doubled. Because both CDACs are active in this fully-differential configuration, a third CDAC must be added to obtain the analog correction signals which increases converter size and cost.

SUMMARY OF THE INVENTION

The present invention is directed to quasi-differential successive-approximation methods and structures for converting analog signals into corresponding digital signals. These methods and structures realize the signal-to-noise improvements of fully-differential SAR ADCs and the calibration accuracy improvements of pseudo-differential SAR ADCs. Structures of the invention operate in a fully-differential mode to establish more-significant bits of the corresponding digital signals and in a pseudo-differential mode to establish the less-significant bits.

An SAR ADC embodiment includes a pair of binarily-weighted capacitor arrays and a third binarily-weighted capacitor array. The pair of capacitor arrays generate differential approximation signals and each includes a least capacitor. The third capacitor array generates single-ended approximation signals and has a greatest capacitor that substantially equals the least capacitor.

The differential approximation signals include a least differential approximation signal and the single-ended approximation signals include a greatest single-ended approximation signal that substantially equals the difference of the least differential approximation signal.

A calibration capacitor array is preferably included to generate correction signals that complement the differential approximation signals.

The novel features of the invention are set forth with particularity in the appended claims. The invention will be best understood from following description when read in conjunction with the accompanying drawings.

DETAILED DESCRIPTION OF THE INVENTION

Figure 3:
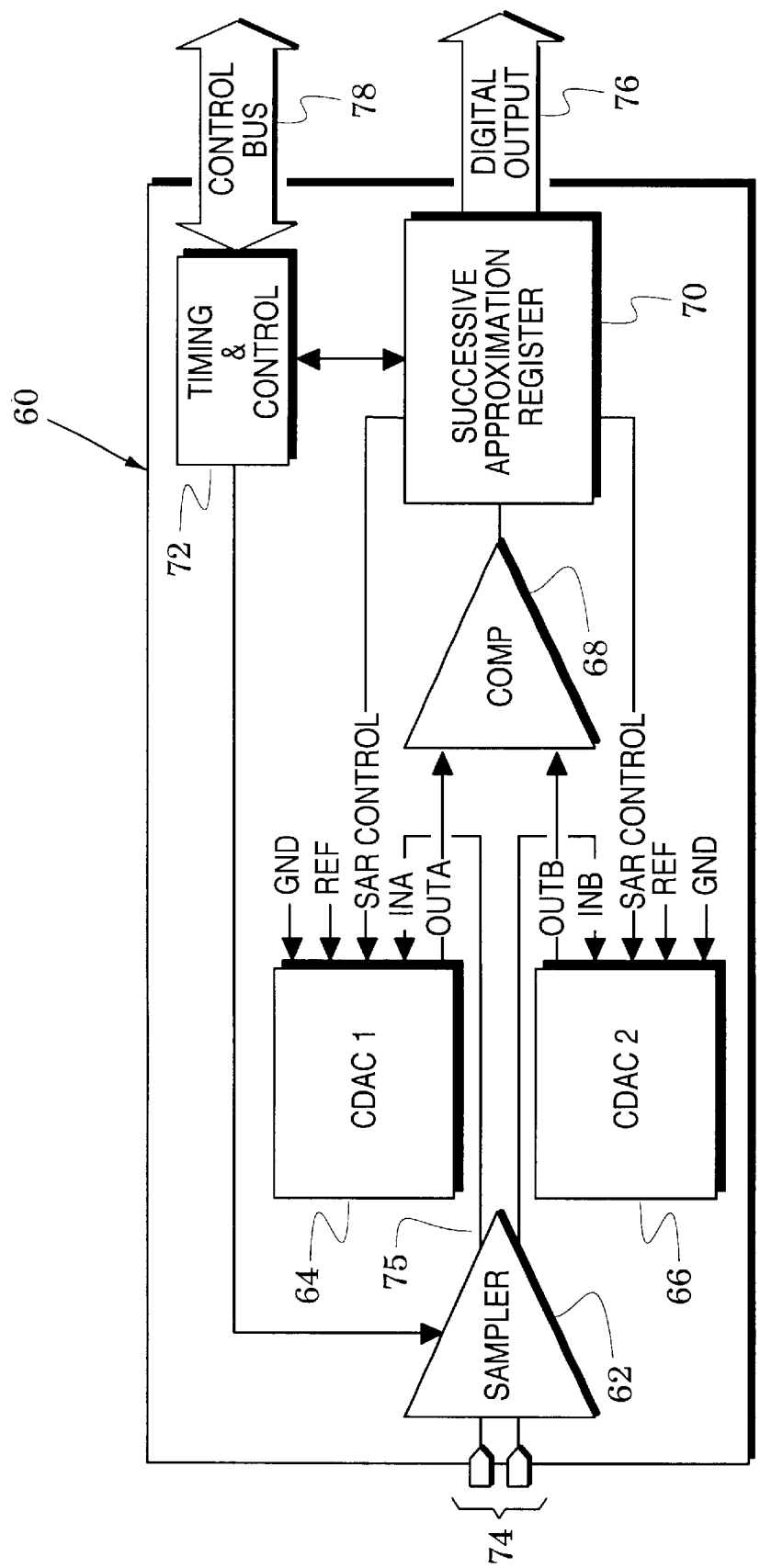
FIG. 3 is a block diagram of a quasi-differential SAR ADC of the present invention.

A quasi-differential r bit SAR ADC 60 of the present invention is illustrated in FIG. 3. The SAR ADC operates in a fully-differential mode to determine the more-significant bits of a successive approximation word and operates in a pseudo-differential mode to determine the less significant bits. Because of these operational modes, the SAR ADC 60 has space in one of its CDACs for a calibration capacitor array which generates correction signals during the fully-differential mode. Accordingly, the SAR ADC 60 realizes an enhanced signal-to-noise ratio and improved accuracy while limiting the number of CDAC structures so as to reduce converter size and cost.

In particular, the SAR ADC 60 includes a differential sampler 62, first and second CDACs 64 and 66, a comparator 68, a successive approximation register 70 and a timing and control module 72. The sampler 62 receives a differential input signal at a differential input port 74 and provides differential samples (INA, INB) of the input signal at its output port 75.

The SAR 70 provides SAR control signals to the first and second CDACs 64 and 66 which control application of the differential samples and reference signals (i.e., REF and GND) to capacitor arrays within the first and second CDACs. In response to this application, the first and second CDACs couple differential analog signals (OUTA, OUTB) to the comparator 68 that approximate the differential samples (INA, INB). The SAR 70 control signals thus comprise successive approximation words which are provided over a digital output bus 76. Timing of the sampler 62 and timing and control of the SAR 70 are provided by the timing and control module 72 which may interface with external structures over an input/output control bus 78.

Figure 4:
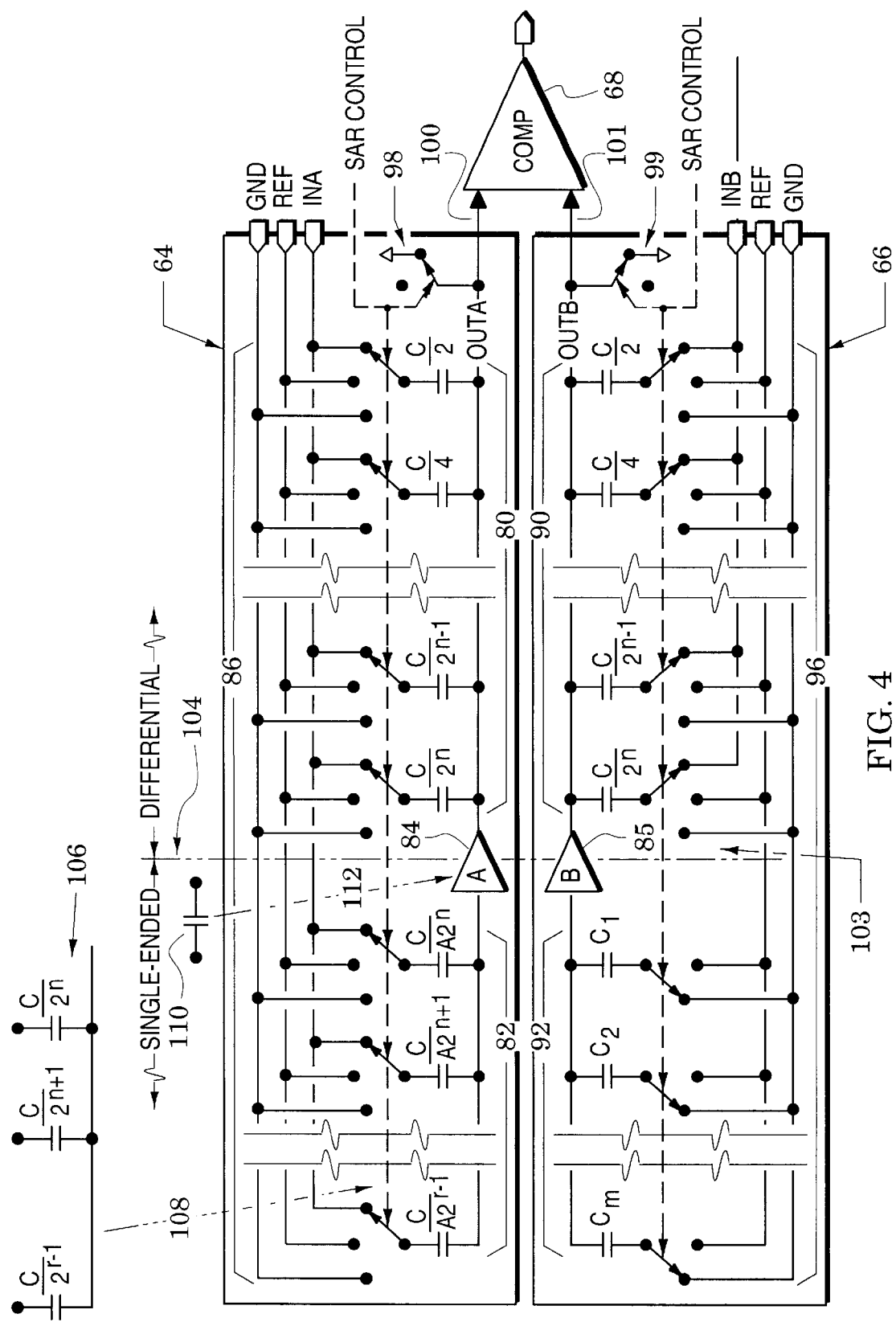
FIG. 4 illustrates an embodiment of the CDACs of the SAR ADC of FIG. 3.

FIG. 4 shows that the first CDAC 64 includes a first binarily-weighted capacitor array 80 (C/2, C/4, - - - C/$2^n$) that has a least capacitor C/$2^n$, a second binarily-weighted capacitor array 82 (C/A$2^n$, C/A$2^{n+1}$, - - - C/A$2^{r-1}$) and a gain element 84 that has a gain A and couples the arrays 80 and 82. The CDAC 64 also includes a first switch array 86 that couples reference signals (REF and GND) and a first portion (INA) of the differential samples to the capacitor arrays 80 and 82 in response to control signals from the SAR (70 in FIG. 3).

The second CDAC 66 includes a third binarily-weighted capacitor array 90 (C/2, C/4, - - - C/$2^n$) that is substantially identical to the first capacitor array 80, a calibration capacitor array 92 ($C_1$, $C_2$, - - - $C_m$) and a second switch array 96 that couples reference signals (REF and GND) and a second portion (INB) of the differential samples to the capacitor array 90 and the reference signals to the capacitor array 92 in response to control signals from the SAR.

The first and second CDACs 64 and 66 also respectively include charge switches 98 and 99 which selectively couple the top plates of array capacitors to ground and to differential input ports 100 and 101 of the comparator 68 in response to the SAR control signals. For reasons that are subsequently described with reference to FIGS. 6 and 7, the capacitor array 90 preferably includes a surrogate capacitor C/$2^n$ that is inserted (e.g., at position 103) to enhance operation of the second CDAC 66.

In operation of the SAR ADC 60 of FIGS. 3 and 4, the SAR control initially grounds the top plates of all capacitor arrays with the charge switches 98 and 99 to permit all capacitors to be charged to the input signals $S_{in}$ of the differential samples. The SAR control then opens the charge switches and couples the capacitor bottom plates (with the switch arrays 86 and 96) to GND so that $-S_{in}$ is present at the capacitor top plates.

The successive approximation word from the SAR (70 in FIG. 3) then applies n bit successive approximation signals to the first and second switch arrays 86 and 96 that cause the first and third capacitor arrays 80 and 90 to couple differential analog signals to the comparator 68 that approximate the differential samples wherein n is less than r. Simultaneously, the successive approximation word provides calibration signals to the second switch array 96 that cause the calibration capacitor array 92 to complement the differential analog signals with correction signals.

That is, some or all of the capacitors $C_1, C_2, --- C_m$ of the calibration capacitor array 92 have predetermined capacitance values such that they form capacitive divider ratios (when switched to REF) that insert predetermined correction voltage signals to the differential input 101 of the comparator 68 for corresponding ones of the n bits of the successive approximation word.

Subsequently, the successive approximation word from the SAR (70 in FIG. 3) applies r-n bit successive approximation signals to the first switch array 86 that causes the second capacitor array 82 to couple single-ended analog signals to the comparator 68 that further approximate the differential samples.

Figure 1:
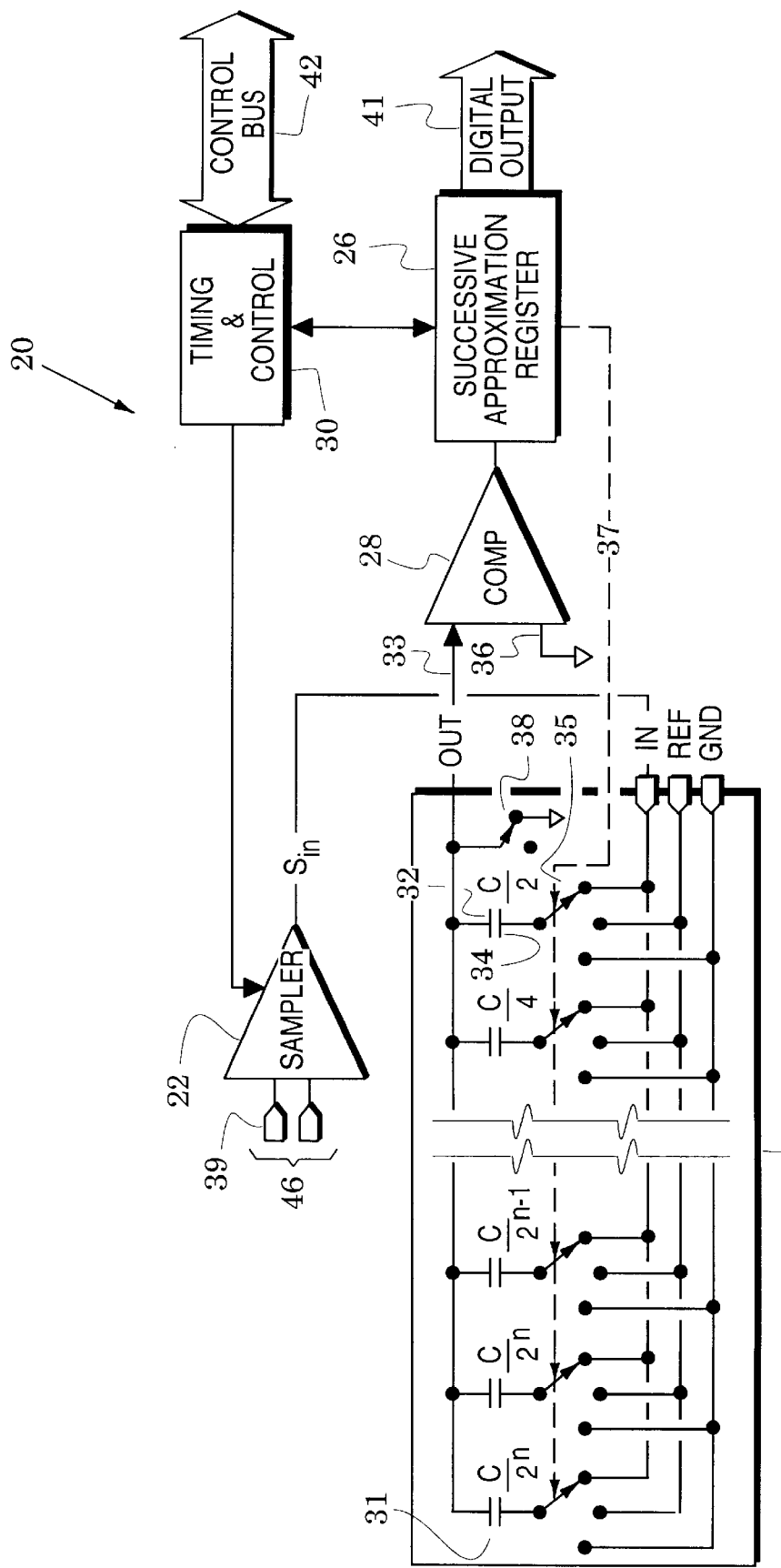
FIG. 1 is a block diagram of a conventional SAR ADC with a CDAC in a single-ended configuration.
Figure 2:
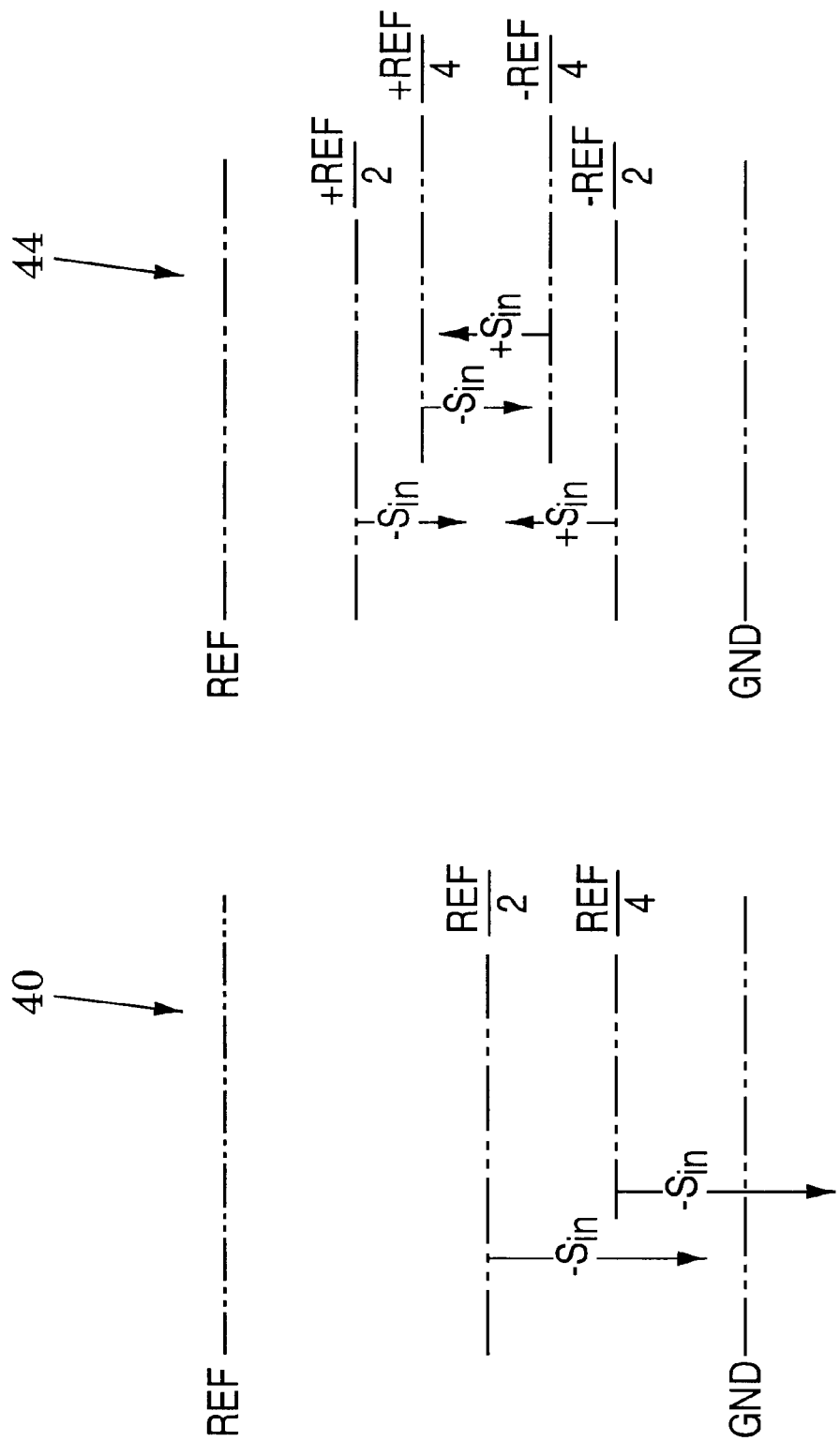
FIGS. 2A and 2B are diagrams that respectively illustrate successive approximation signals in the SAR ADC of FIG. 1 and in a fully-differential SAR ADC.

The SAR ADC 60 thus determines n bits of the successive approximation word differentially as exemplified in the diagram 44 of FIG. 2B and as indicated by the operational dividing line 104 in FIG. 4. Because these more-significant bits establish the dynamic range of the SAR ADC (and double it relative to a conventional single-ended SAR ADC), its signal-to-noise ratio is significantly enhanced (e.g., up to 6 decibels).

The SAR ADC 60 subsequently determines r-n bits of the successive approximation word single-endedly as exemplified in the diagram of FIG. 2A. Because these less-significant bits are established with the second capacitor array 82 of the first CDAC 64, the calibration capacitor array 92 is available for insertion of correction signals that calibrate the more significant bits.

The SAR ADC 60 thus operates in a quasi-differential fashion which realizes the enhanced SNR of fully-differential operations and, in addition, provides calibration correction signals while limiting the required CDAC structure. In this quasi-differential operation, it combines the desirable attributes of conventional fully-differential and pseudo-differential SAR ADC configurations.

As previously described, successive approximation signals at the bottom plates of the first and second capacitor arrays 80 and 90 change in equal and opposite directions which effectively doubles the signal steps corresponding to the first n bits of the successive approximation word. In order to preserve the linearity of binary bit weighting, a corresponding signal step doubling must be realized in the pseudo-differential operation of the second capacitor array 82.

As shown in FIG. 4, the gain element 84 (with its gain of A) is inserted between these arrays so that the capacitors of the second capacitor array 82 are effectively $C/2^n$, $C/2^{n+1}$ --- $C/2^{r-1}$ and realize the requisite signal step doubling in the pseudo-differential operation. In order to retain signal balance and to increase the correction range of the calibration array, a corresponding amplifier 85 may be inserted between the third and calibration capacitor arrays as shown in FIG. 4. The gain B of this amplifier may take on various values and may equal A.

In another SAR ADC embodiment, the signal step doubling is realized by removing the gain element 84 and doubling the capacitors of the second capacitor array. This is realized by replacing the capacitors $C/A2^{n+1}$, $C/A2^{n+}$, --- $C/A2^{r-1}$ with the capacitors $C/2^n$, $C/2^{n+1}$, --- $C/2^{r-1}$ of capacitor array 106 as indicated by substitution arrow 108.

The relationship between the first and second capacitor arrays 80 and 82 may be described by noting that the binarily-weighted capacitor array 80 has a least capacitor $C/2^n$ and the binarily-weighted capacitor array 106 has a greatest capacitor $C/2^n$ that substantially equals the least capacitor. This is in contrast to a conventional binarily-weighted capacitor array in which the capacitance of each subsequent capacitor is substantially ½ that of its preceding capacitor.

Equivalently, this array relationship may be described by noting that the first and third binarily-weighted capacitor arrays 80 and 90 generate differential approximation signals that approximate the differential samples to thereby determine more-significant bits of the corresponding digital signals wherein these differential approximation signals include a least differential approximation signal (i.e., that generated by the least capacitors of these arrays).

In contrast, the second binarily-weighted capacitor array 106 generates single-ended approximation signals that further approximate the differential samples to thereby determine less-significant bits wherein the single-ended approximation signals include a greatest single-ended approximation signal that substantially equals the difference of the least differential approximation signal.

It is helpful at this point to note that a conventional n bit capacitor array has plate areas that differ by a factor of $2^n$. For a variety of reasons (e.g., simplify fabrication and reduce ADC size), it is desirable to reduce this relative plate-area difference and this is often done by inserting a coupling capacitor which reduces the capacitance of the capacitor array downstream from the coupling capacitor. Therefore, the plate areas of the capacitors on the upstream side can be reduced.

Accordingly, another SAR ADC embodiment is realized by replacing the gain element 84 of FIG. 4 with a coupling capacitor 110 as indicated by replacement arrow 112. The capacitance of the coupling capacitor and the capacitors of the first and second capacitor arrays are chosen so that the capacitor array 80 is binarily-weighted and has a least capacitor and the series combination of the coupling capacitor 110 and the second capacitor array forms a binarily-weighted capacitor array with a greatest capacitor that substantially equals the least capacitor.

The gain A of the gain element 84 can have any value (e.g., 2) so long as the series combination of the gain element and the second capacitor array forms a binarily-weighted capacitor array with a greatest capacitor that substantially equals the least capacitor. To summarize, any capacitor system is in accordance with the invention so long as it forms a first binarily-weighted capacitor array with a least capacitor and a second binarily-weighted capacitor array with a greatest capacitor that substantially equals the least capacitor.

Figure 5:
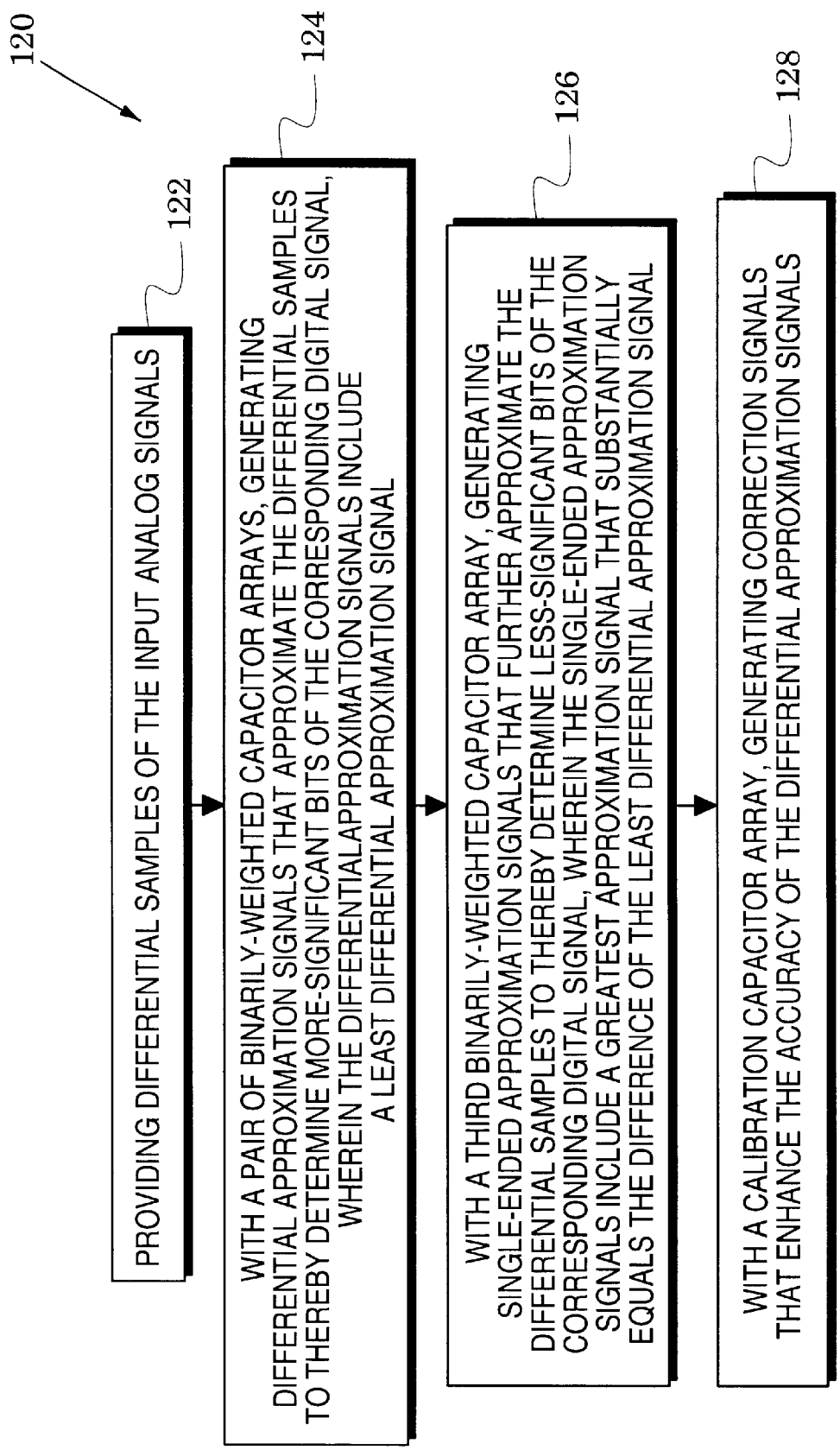
FIG. 5 is a flow diagram that illustrates quasi-differential successive-approximation methods of the present invention.

FIG. 5 is a flow diagram 120 which illustrates a method of the invention for converting analog signals to corresponding digital signals via successive approximations of the analog signal. In an initial process step 122 of the method, differential samples of the analog signal are provided.

With a pair of substantially-equivalent binarily-weighted capacitor arrays, differential approximation signals are then generated in process step 124 that approximate the differential samples to thereby determine more-significant bits of the corresponding digital signals wherein the differential approximation signals include a least differential approximation signal.

Single-ended approximation signals are generated in process step 126 with a third binarily-weighted capacitor array. The single-ended approximation signals further approximate the differential samples to thereby determine less-significant bits of the corresponding digital signals wherein the single-ended approximation signals include a greatest single-ended approximation signal that substantially equals the difference of the least differential approximation signal.

Preferably, correction signals are added by generating them with a calibration capacitor array in process step 128 to enhance the accuracy of the differential approximation signals.

Another method embodiment is formed by modifying process steps 124 and 126 to the following process steps 124A and 126A. With first and second substantially-equivalent binarily-weighted capacitor arrays that each have a least capacitor, differential samples of the analog signals are successively and differentially approximated in a process step 124A to determine more-significant bits of the corresponding digital signals. With a third binarily-weighted capacitor array that has a greatest capacitor that substantially equals the least capacitor, the differential samples are successively and single-endedly approximated in a process step 126A to determine less-significant bits of the corresponding digital signals.

Figure 6:
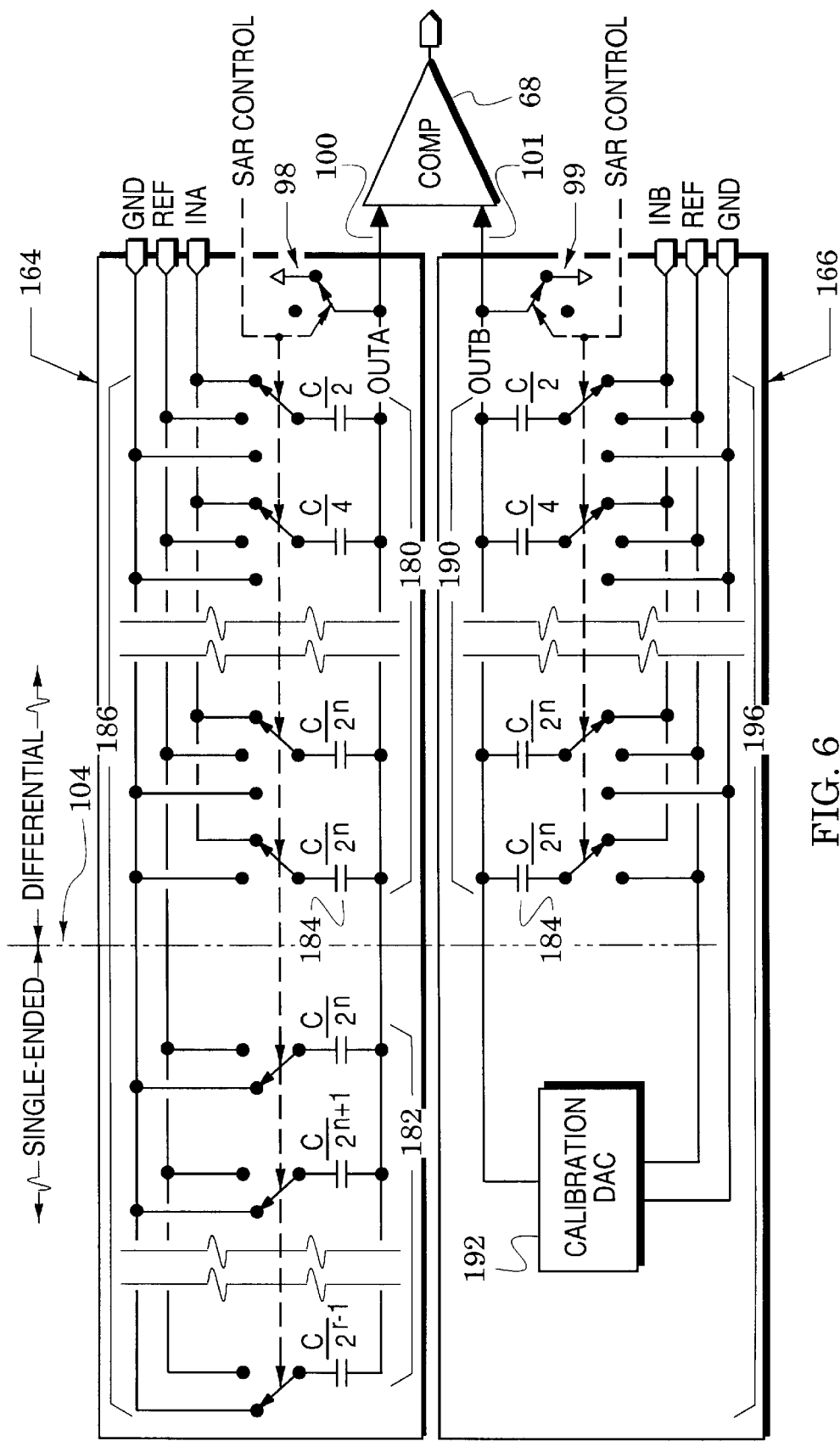
FIGS. 6 and 7 illustrates other embodiments of the CDACs of the SAR ADC of FIG. 3.

FIG. 6 illustrates CDAC embodiments 164 and 166 which are similar to the embodiments 64 and 66 of FIG. 4 with like elements indicated by like reference numbers. The CDAC 164 has a first binarily-weighted capacitor array 180 that has a least capacitor $C/2^n$ and a second binarily-weighted capacitor array 182 (equivalent to capacitor array 106 of FIG. 4) that has a greatest capacitor $C/2^n$ that substantially equals the least capacitor. The CDAC 166 has a third binarily-weighted capacitor array 190 that has a least capacitor $C/2^n$ and a calibration DAC 192 that contains a calibration capacitor array (e.g., the array 92 of FIG. 4).

In contrast to the CDAC embodiments of FIG. 4, each of the first and third capacitor arrays 180 and 190 add a surrogate capacitor 184 that has a capacitance of $C/2^n$. In addition, the switch array 86 of FIG. 4 has been modified to a switch array 186 that does not provide the differential input signal INA to the second capacitor array 182 but does provide the differential input signal INA and the GND signal to its respective surrogate capacitor 184. The switch array 96 of FIG. 4 has been modified to a switch array 196 that provides the differential input signal INB and the REF signal to its respective surrogate capacitor 184.

Operation of the CDACs 164 and 166 is similar to that of the CDACs 64 and 66 of FIG. 4 except the surrogate capacitors 184 also initially receive the differential input signals INA and INB and subsequently (during the successive approximation process), the surrogate capacitor associated with the capacitor array 182 receives the GND signal and the surrogate capacitor associated with the calibration DAC 192 receives the REF signal.

Figure 7:
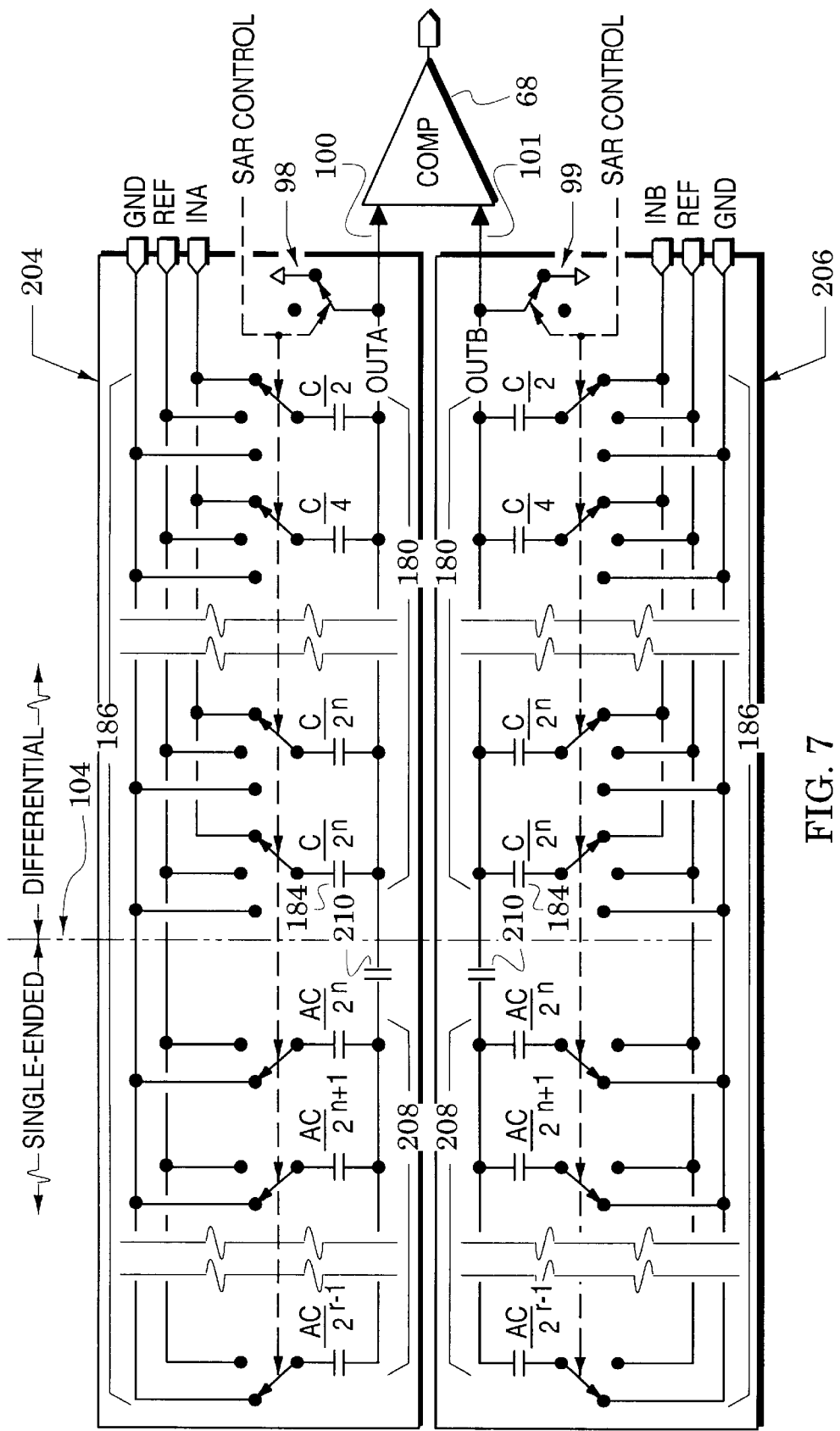

Operation of the surrogate capacitors is described with reference to FIG. 7 which illustrates CDAC embodiments 204 and 206. These CDAC embodiments are similar to the embodiments 164 and 166 of FIG. 6 with like elements indicated by like reference numbers. In contrast to the CDACs 164 and 166, a capacitor array 208 in CDAC 204 replaces the capacitor array 182 and a coupling capacitor 210 has been inserted between the capacitor arrays 180 and 208.

It is initially noted that the capacitor arrays 80 and 82 of FIG. 4 have capacitors that range from a greatest capacitor $C/2$ to a least capacitor $C/2^{r-1}$. When r is large (e.g., 16), the plate areas of these capacitors differ significantly which complicates fabrication of the CDACs 64 and 66. These complications are reduced in FIG. 7 by the coupling capacitor 210 because it significantly reduces the difference between the largest and smallest plate areas. In particular, the capacitors of the capacitor array 208 are increased by a factor A (e.g., to sizes similar to those of capacitor array 180) and the value of the coupling capacitor 210 is chosen so that its series combination with the capacitors of the capacitor array 208 reduces their effective capacitance by the same factor A.

In order to prevent this increased capacitance of capacitor array 208 from slowing the sampling processes of the CDAC 204, the surrogate capacitor 184 is inserted and coupled to the differential input signal INA in place of the capacitor array 208. During the successive approximation process, the bottom plate of this surrogate capacitor is coupled to GND. In order to preserve circuit symmetry (which enhances signal matching, reduces generation of spurious signal levels and simplifies fabrication), the CDAC 206 is a copy of the CDAC 204 (it is accordingly shown to have capacitor arrays 180 and 208, switch array 186 and coupling capacitor 210). To facilitate this identity, the switch array 186 has been slightly modified to provide signal REF to the upper surrogate capacitor and signal GND to the lower surrogate capacitor although they are not used in operation.

In summary, each of the capacitor arrays 180 and 190 includes a binarily-weighted capacitor array which has a least capacitor ($C/2^n$) and each further includes a surrogate capacitor (184) that substantially equals the least capacitor.

Quasi-differential successive-approximation structures and methods have been described for converting analog signals to corresponding digital signals. SAR ADCs of the invention facilitate a quasi-differential process that obtains the enhanced SNR of conventional fully-differential processes and the calibration correction signals of conventional pseudo-differential processes.

The conceptual structures of the invention may be realized with various semiconductor (e.g., complementary metal-oxide semiconductor (CMOS)) technologies and with various detailed fabrication techniques. Although a sampler (e.g., sampler 62 in FIG. 3) has been included in embodiments of the invention, these embodiments may be simplified by removing the sampler and realizing its sampling processes with the switch arrays and charge switches (e.g., 86, 96, 89 and 99 in FIG. 4) of the invention.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of converting analog signals to corresponding digital signals via successive approximations of said analog signals, the method comprising the steps of:

with a pair of substantially-equivalent binarily-weighted capacitor arrays, generating differential approximation signals that approximate said analog signals to thereby determine more-significant bits of said corresponding digital signals wherein said differential approximation signals include a least differential approximation signal; and with a third binarily-weighted capacitor array, generating single-ended approximation signals that further approximate said analog signals to thereby determine less-significant bits of said corresponding digital signals wherein said single-ended approximation signals include a greatest single-ended approximation signal that substantially equals the difference of said least differential approximation signal.

2. The method of claim 1, further including the step of generating, with a calibration capacitor array, correction signals that enhance the accuracy of said differential approximation signals.

3. The method of claim 2, further including the steps of:
coupling said third capacitor array to one of said pair of capacitor arrays; and
coupling said calibration capacitor array to the other of said pair of capacitor arrays.

4. The method of claim 1, wherein said differential approximation signals generating step includes the steps of:
selectively coupling said pair of capacitor arrays to reference signals and said analog signals to generate said differential approximation signals; and
comparing said differential approximation signals to said analog signals.

5. The method of claim 1, wherein said single-ended approximation signals generating step includes the steps of:
selectively coupling said third capacitor array to reference signals and said analog signals to generate said single-ended approximation signals; and
comparing said single-ended approximation signals to said analog signals.

6. The method of claim 1, further including the steps of:
configuring said pair of capacitor arrays to have least capacitors; and
configuring said third capacitor array to have a greatest capacitor substantially equal to said least capacitors.

7. The method of claim 6, further including the step of configuring said third capacitor array as the series combination of a coupling capacitor and a fourth capacitor array wherein said series combination has a greatest capacitor substantially equal to said least capacitors.

8. A method of converting analog signals to corresponding digital signals via successive approximations of said analog signals, the method comprising the steps of:
with a pair of substantially-equivalent binarily-weighted capacitor arrays, generating differential approximation signals that approximate said analog signals to thereby determine more-significant bits of said corresponding digital signals wherein said differential approximation signals include a least differential approximation signal;
with a third binarily-weighted capacitor array, generating single-ended approximation signals that further approximate said analog signals to thereby determine less-significant bits of said corresponding digital signals wherein said single-ended approximation signals include a greatest single-ended approximation signal that substantially equals the difference of said least differential approximation signal;
coupling said third capacitor array to a selected one of said pair of capacitor arrays; and
inserting a surrogate capacitor into said selected capacitor array that is substantially equal to said least capacitor.

9. The method of claim 6, further including the steps of configuring said third capacitor array as the series combination of an amplifier and a fourth capacitor array wherein said series combination has a greatest capacitor substantially equal to said least capacitors.

10. The method of claim 1, further including the steps of:
sampling said analog signals to provide differential samples; and
replacing said analog signals in said generating steps with said differential samples.

11. A method of converting analog signals to corresponding digital signals via successive approximations of said analog signal, the method comprising the steps of:
with a pair of substantially-equivalent binarily-weighted capacitor arrays that each have a least capacitor, successively and differentially approximating said analog signals to determine more-significant bits of said corresponding digital signals; and
with a third binarily-weighted capacitor array that has a greatest capacitor that substantially equals said least capacitor, successively and single-endedly approximating said analog signals to determine less-significant bits of said corresponding digital signals.

12. The method of claim 11, further including the step of generating, with a calibration capacitor array, correction signals that enhance the accuracy of said differential approximation signals.

13. The method of claim 11, further including the step of configuring said third capacitor array as the series combination of a coupling capacitor and a fourth capacitor array wherein said series combination has a greatest capacitor substantially equal to said least capacitors.

14. A method of converting analog signals to corresponding digital signals via successive approximations of said analog signal, the method comprising the steps of:
with a pair of substantially-equivalent binarily-weighted capacitor arrays that each have a least capacitor, successively and differentially approximating said analog signals to determine more-significant bits of said corresponding digital signals;
with a third binarily-weighted capacitor array that has a greatest capacitor that substantially equals said least capacitor, successively and single-endedly approximating said analog signals to determine less-significant bits of said corresponding digital signals;
coupling said third capacitor array to a selected one of said pair of capacitor arrays; and
inserting a surrogate capacitor into said selected capacitor array that is substantially equal to said least capacitor.

15. The method of claim 11, further including the steps of configuring said third capacitor array as the series combination of an amplifier and a fourth capacitor array wherein said series combination has a greatest capacitor substantially equal to said least capacitors.

16. The method of claim 11, further including the steps of:
sampling said analog signals to provide differential samples; and
replacing said analog signals in said generating steps with said differential samples.

17. A successive approximation analog-to-digital converter that converts analog signals to corresponding r bit digital signals, comprising:
first and second switched-capacitor digital-to-analog converters (CDACs) that form differential samples of said analog signals wherein said first CDAC includes:

a) a first binarily-weighted capacitor array that has a least capacitor; and
   b) a second binarily-weighted capacitor array that is coupled to said first capacitor array and has a greatest capacitor that substantially equals said least capacitor;
   and said second CDAC includes:
   a) a third binarily-weighted capacitor array that is substantially similar to said first capacitor array; and
   b) a calibration capacitor array that is coupled to said third capacitor array;
   a comparator that is differentially coupled to said first and second CDACs and generates comparator output signals; and
   a successive approximation register (SAR) that monitors said comparator output signals and, in response,
   a) provides first successive approximation signals to said first and second CDACs that cause said first and third capacitor arrays to couple differential analog signals to said comparator that approximate said differential samples;
   b) provides second successive approximation signals to said first CDAC that cause said second capacitor array to couple single-ended analog signals to said comparator that further approximate said differential samples; and
   c) provides calibration signals to said second CDAC that cause said calibration capacitor array to complement said differential analog signals with correction signals;
   said corresponding digital signals thereby provided in the form of said first and second successive approximation signals.

18. The converter of claim 17, further including a differential sampler that provides said differential samples in response to said analog signals.

19. The converter of claim 17, wherein said second capacitor array comprises:
   a fourth binarily-weighted capacitor array; and
   a coupling capacitor that couples said fourth capacitor array to said first capacitor array;
   wherein the series combination of said fourth capacitor array and said coupling capacitor forms said greatest capacitor.

20. A successive approximation analog-to-digital converter that converts analog signals to corresponding r bit digital signals, comprising:
   first and second switched-capacitor digital-to-analog converters (CDACs) that form differential samples of said analog signals wherein said first CDAC includes:
   a) a first binarily-weighted capacitor array that has a least capacitor; and
   b) a second binarily-weighted capacitor array that is coupled to said first capacitor array and has a greatest capacitor that substantially equals said least capacitor;
   and said second CDAC includes:
   a) a third binarily-weighted capacitor array that is substantially similar to said first capacitor array; and
   b) a calibration capacitor array that is coupled to said third capacitor array;
   a comparator that is differentially coupled to said first and second CDACs and generates comparator output signals; and
   a successive approximation register (SAR) that monitors said comparator output signals and, in response,
   a) provides first successive approximation signals to said first and second CDACs that cause said first and third capacitor arrays to couple differential analog signals to said comparator that approximate said differential samples;
   b) provides second successive approximation signals to said first CDAC that cause said second capacitor array to couple single-ended analog signals to said comparator that further approximate said differential samples; and
   c) provides calibration signals to said second CDAC that cause said calibration capacitor array to complement said differential analog signals with correction signals;
   wherein said first capacitor array includes a surrogate capacitor that substantially equals said least capacitor;
   said corresponding digital signals thereby provided in the form of said first and second successive approximation signals.

21. The converter of claim 17, wherein said second binarily-weighted capacitor array comprises:
   a fourth binarily-weighted capacitor array; and
   an amplifier that couples said fourth capacitor array to said first capacitor array.

22. The converter of claim 17, wherein:
   said first CDAC further includes a first switch array that selectively couples reference signals to said first and second capacitor arrays in response to said SAR; and
   said second CDAC further includes a second switch array that selectively couples said reference signals to said third capacitor array and said calibration capacitor array in response to said SAR.

23. The converter of claim 17, further including first and second switches that selectively couple said first and second CDACs to said comparator in response to said SAR.

24. A successive approximation analog-to-digital converter that converts analog signals to corresponding digital signals, comprising:
   a comparator that generates comparator output signals in response to differences between signals at first and second comparator input ports;
   a successive approximation register (SAR);
   a first binarily-weighted capacitor array that includes a least capacitor and is coupled to said first comparator input port;
   a second binarily-weighted capacitor array that includes a greatest capacitor that substantially equals said least capacitor and is coupled to said first comparator input port;
   a third binarily-weighted capacitor array that is substantially identical to said first capacitor array and coupled to said second comparator input port;
   a calibration capacitor array that is coupled to said second comparator input port;
   a first switching network that responds to successive approximation signals from said SAR and selectively couples said first and second capacitor arrays to said analog signals and to reference signals;
   a second switching network that responds to successive approximation signals from said SAR and selectively couples said third array to said analog signals and to said reference signals and selectively couples said calibration capacitor array to said reference signals;
   wherein said SAR monitors said comparator output signals and, in response, a) provides first successive approximation signals that cause said first and second capacitor arrays to couple differential analog signals to said comparator that approximate said analog signals;

b) provides second successive approximation signals that cause said third capacitor array to couple single-ended analog signals to said comparator that further approximate said analog signals; and c) provides calibration signals that cause said calibration capacitor array to couple correction signals to said said differential analog signals;

said corresponding digital signals thereby provided in the form of said first and second successive approximation signals.

25. The converter of claim 21, wherein said second capacitor array comprises:

a fourth binarily-weighted capacitor array; and a coupling capacitor that couples said fourth capacitor array to said first capacitor array;

wherein the series combination of said fourth capacitor array and said coupling capacitor forms said greatest capacitor.

26. A successive approximation analog-to-digital converter that converts analog signals to corresponding digital signals, comprising:

a comparator that generates comparator output signals in response to differences between signals at first and second comparator input ports;

a successive approximation register (SAR);

a first binarily-weighted capacitor array that includes a least capacitor and is coupled to said first comparator input port;

a second binarily-weighted capacitor array that includes a greatest capacitor that substantially equals said least capacitor and is coupled to said first comparator input port;

a third binarily-weighted capacitor array that is substantially identical to said first capacitor array and coupled to said second comparator input port;

a calibration capacitor array that is coupled to said second comparator input port;

a first switching network that responds to successive approximation signals from said SAR and selectively couples said first and second capacitor arrays to said analog signals and to reference signals;

a second switching network that responds to successive approximation signals from said SAR and selectively couples said third array to said analog signals and to said reference signals and selectively couples said calibration capacitor array to said reference signals;

wherein said SAR monitors said comparator output signals and, in response, a) provides first successive approximation signals that cause said first and second capacitor arrays to couple differential analog signals to said comparator that approximate said analog signals;

b) provides second successive approximation signals that cause said third capacitor array to couple single-ended analog signals to said comparator that further approximate said analog signals; and c) provides calibration signals that cause said calibration capacitor array to couple correction signals to said said differential analog signals;

and wherein said first capacitor array includes a surrogate capacitor that substantially equals said least capacitor;

said corresponding digital signals thereby provided in the form of said first and second successive approximation signals.

* * * * *